United States Patent
Young et al.

(10) Patent No.: US 6,491,042 B1
(45) Date of Patent: Dec. 10, 2002

(54) POST ETCHING TREATMENT PROCESS FOR HIGH DENSITY OXIDE ETCHER

(75) Inventors: Bao-Ru Young, I-Lam (TW); Chia-Shiung Tsai, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/206,745

(22) Filed: Dec. 7, 1998

(51) Int. Cl.7 .......................... H01L 21/302; B08B 7/00
(52) U.S. Cl. .......................... 134/1.1; 134/1.2; 134/21; 134/22.1
(58) Field of Search .......................... 134/1.1, 1.2, 21, 134/22.1; 438/696, 695, 723, 724, 734, 743, 744

(56) References Cited

U.S. PATENT DOCUMENTS

| | | | |
|---|---|---|---|
| 5,468,342 A | * 11/1995 | Nulty et al. | 156/643.1 |
| 5,607,880 A | 3/1997 | Suzuki et al. | 437/195 |
| 5,611,888 A | 3/1997 | Bosch et al. | 156/643.1 |
| 5,647,953 A | 7/1997 | Williams et al. | 156/643.1 |
| 5,667,631 A | 9/1997 | Holland et al. | 216/13 |
| 5,756,400 A | * 5/1998 | Ye et al. | 438/710 |
| 5,968,278 A | * 10/1999 | Young et al. | 134/1.1 |
| 5,993,594 A | * 11/1999 | Wicker et al. | 156/345 |
| 6,035,868 A | * 3/2000 | Kennedy et al. | 134/1.1 |
| 6,057,247 A | * 5/2000 | Imai et al. | 438/714 |
| 6,227,211 B1 | * 5/2001 | Yang et al. | 134/1.1 |

FOREIGN PATENT DOCUMENTS

JP     10-209118    * 8/1998

* cited by examiner

Primary Examiner—George Goudreau
(74) Attorney, Agent, or Firm—George O. Saile; Stephen B. Ackerman

(57) ABSTRACT

A three-step polymer removal process that reverses the conventional sequence in which polymer is removed. In the preferred embodiment of the present invention the polymer is first removed from the Gas Deposition Table, after this the polymer is stripped from the inner surface of the created contact hole.

25 Claims, 2 Drawing Sheets

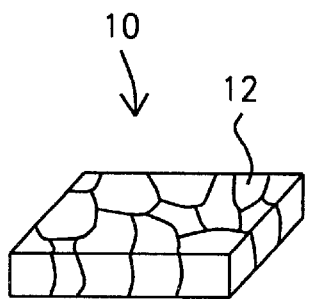
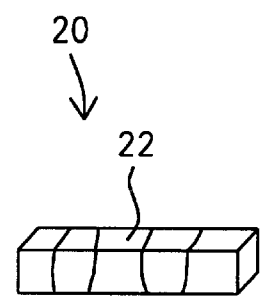
*FIG. 1a*        *FIG. 1b*
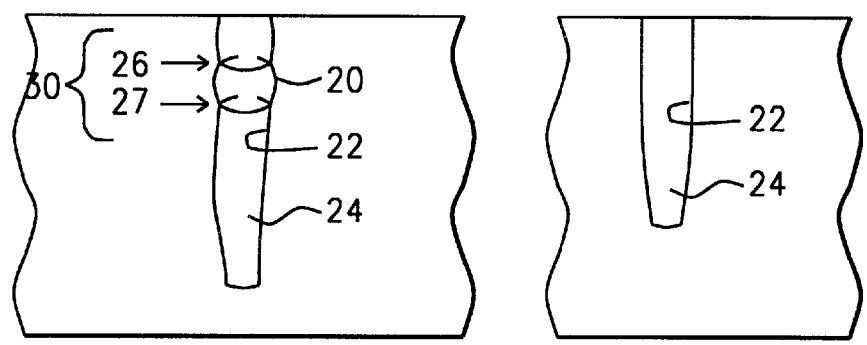
*FIG. 2*        *FIG. 3*

POST ETCHING TREATMENT PROCESS FOR HIGH DENSITY OXIDE ETCHER

FIELD OF THE INVENTION

The invention relates to the plasma etching of a silicon wafer in the manufacture of integrated circuits.

DESCRIPTION OF THE PRIOR ART

As the density of circuit components contained within a semiconductor die has increased and the circuit components have decreased in size and are spaced closer together, it has become increasingly difficult to access selectively a particular region of the silicon wafer through the various layers that are typically superimposed on the surface of the silicon wafer without undesired interference with other active regions.

It is especially important to have a technology that can etch openings that have essentially vertical walls, most notably when the openings are to extend deeply into the surface layers. Additionally, to tolerate some misalignment in the masks used to define such openings, it is advantageous to provide protection to regions that need isolation but that inadvertently lie partially in the path of the projected opening. To this end it is sometimes the practice to surround such regions with a layer of material that resists etching by the process being used to form the openings.

Accordingly, a technology that provides the desired results will need an appropriate choice both in the materials used in the layers and the particular etching process used with the materials chosen.

Dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic. This makes possible etching with nearly vertical sidewalls.

Basically, in plasma etching as used in the manufacturing of silicon integrated devices, a silicon wafer on whose surface has been deposited various layers, is positioned on a first electrode in a chamber that also includes a second electrode spaced opposite the first. As a gaseous medium that consists of one or more gasses is flowed through the chamber, an r-f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved.

While elaborate theories have been developed to explain the plasma process, in practice most of such processes have been developed largely by experimentation involving trial and error of the relatively poor predictability of results otherwise.

Moreover, because of the number of variables involved and because most etching processes depend critically nor only on the particular materials to be etched bur also on the desired selectivity and anisotropy, such experimentation can be time consuming while success often depends on chance.

The reliability of a metal interconnect is most commonly described by a lifetime experiment on a set of lines to obtain the medium time to failure. The stress experiment involves stressing the lines at high current densities and at elevated temperatures. The failure criterion is typically an electrical open for non-barrier conductors or a predetermined increase in line resistance for barrier metalization.

The mean time to failure is dependent on the line geometry where this failure is directly proportional to the line width and the line thickness. Experimentally, it has been shown that the width dependence is a function of the ratio of the grain size d of the film and the width of the conductor w. As the ratio w/d decreases, the mean time to failure will increase due to the bamboo effect.

FIG. 1a shows a non-bamboo structure 10 in a wider line, that is a thin film or a fine line that is dominated by triple points 12.

FIG. 1b shows a bamboo-like grain structure 20 in a sub-micron line. As the grain size increases with respect to the line width, the interconnecting points of the triple points parallel to the length of the conductor decrease and even vanish. So the probability of voids accumulating along the grain boundaries is reduced, thus retarding the electro-migration process. The final grain structure 22 of the Al film is not only a function of the metal deposition conditions but is also strongly dependent on post-metalization annealing temperatures and the texture of the underlying surface.

U.S. Pat. No. 5,611,888 (Bosche et al.) shows contact hole plasma etch process.

U.S. Pat. No. 5,667,631. (Holland et al.) and U.S. Pat. No. 5,607,880 (Suzuki et al.) show dry etch processes.

U.S. Pat. No. 5,647,953 (Williams et al.) shows a post etch treatment to clean the etcher.

SUMMARY OF THE INVENTION

It is the primary objective of the present invention to eliminate bamboo profile on the inner surface of semiconductor contact holes.

Another objective of the present invention is to decrease the electrical resistivity for the contact holes within semiconductor devices.

Yet another objective of the present invention is to prevent the negative effects of the F-ion that is released during the GDP cleaning process.

Yet another objective of the present inventions is to increase the benefit of the protective polymer layer in the inside of the contact holes.

The present invention teaches a post etch treatment (PET) to perform the Gas Distribution Plate (GDP) polymer cleaning before the step of removing polymer in the contact holes. In a typical and previous sequence of post etch treatment (PET) procedures, the polymer in contact holes is remove first after which GDP polymer cleaning is performed. It is claimed that the polymer inside the contact holes avoids the formalion of the so-called bamboo rings within the contact holes. By having the polymer present within the contact holes while the GDP polymer cleaning is performed, no bamboo rings are formed. By removing the polymer within the contact holes after GDP polymer etching, the sidewalls of the contact holes are devoid of bamboo rings.

BRIEF DESCRIPTION OF THE DRAWINGS

FIG. 1a shows a non-bamboo structure in a wider line,

FIG. 1b shows a bamboo like grain structure in a sub-micron line.

FIG. 2 shows the formation of bamboo structures within the inner surface of the contact holes.

FIG. 3 shows the absence of the formation of bamboo rings within the inner surface of the contact holes.

DETAILED DESCRIPTION OF THE PREFERRED EMBODIMENT

Figure 4:
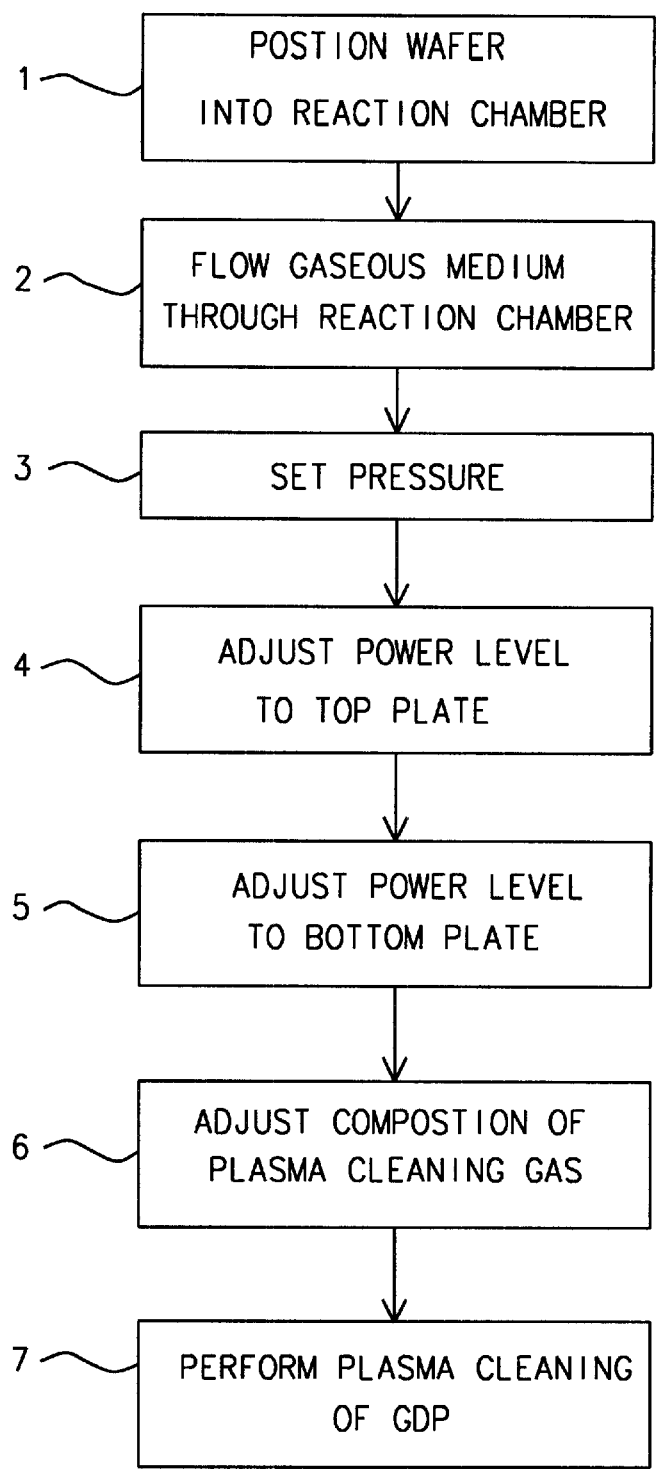
FIG. 4 shows a flow chart of the steps performed during polymer stripping.

FIG. 2 shows the formation of the bamboo structures 20 within the inner surface 22 of the contact hole 24 of the semiconductor devices. The basic reason for the formation of these bamboo structures is that, during the GDP polymer etching process, F-ions are formed that can attack the inner surface of the contact holes. If however a protective coating is present that protects the inside surface of the contact holes, the F-ions can be blocked from attacking this surface.

It must be understood that polymer is present at both the GDP and on the inside surface of the contact holes. The cleaning processes for removing these two different polymers are distinct and different. A choice can therefore be made as to which of the two polymers to remove first. By first removing the GDP polymers, the polymer remains in place on the inner surface of the contact holes. By first removing the GDP polymers than, even though F-ions are formed during this process, the F-ions cannot attack the inner surface of the contact holes since the polymer within these contact holes is still present.

The inside surface of the area 30 within the opening 24 forms a layer of doped borophosphosilicate glass (BPSG). The top ring 26 predominantly contains platinum tetra ethyl ortho silicate (PTTEOS), the lower ring 28 predominantly contains borophospho tatra ethyl ortho silicate (BPTEOS).

The post etch treatment (PET) process of first stripping the polymer from the contact holes, then cleaning the polymer of the Gas Distribution Plates (GDP) is as follows. The three processing steps are performed in the order in which they are listed.
Process Step #1: Contact Hole Polymer Strip
Etching chamber pressure: 10 to 20 milli Torr
Source or top plate power: 1000 to 1500 Watts
Bottom plate power: 175 to 225 Watts
Gas composition: 700 to 800 SCCM $O_2$
Process Step #2: GDP Cleaning
Etching chamber pressure: 70 to 90 milli Torr
Source or top plate power: 1500 to 2000 Watts
Bottom plate power: 0 Watts
Gas composition: 1250 to 1750 SCCM $O_2$
Process Step #3: GDP Cleaning
Etching chamber pressure: 70 to 90 milli Torr
Source or top plate power: 800 to 1200 Watts
Bottom plate power: 0 Watts
Gas composition: 1350 to 1650 SCCM $O_2$
Note: SCCM stands for Standard Cubic Centimeter per Minute, a measure of gas flow.

FIG. 3 shows the inner surface 2 of the contact hole 24 if the Gas Distribution Plates (GDP) polymer cleaning is performed before the cleaning of the polymer from the contact holes.

The protective effect of the polymer layer within the inner surface of the contact holes is obvious, the F-ions (formed during the first cleaning process of removing the polymer form the GDP) have not been able to attack the inner walls of the contact holes. This leaves a smooth surface of the contact hole after the polymer is removed from the inner surface of the hole. No bamboo structure is visible.

FIG. 4 shows a flowchart of the steps performed during polymer stripping, that is a method for removing or etching polymer depositions in a plasma process chamber wherein substrates are processed. Step 1 is the positioning of the wafer in a plasma reactor that includes a chamber within which there can be created a radio frequency discharge and wherein pressure can be adjusted. Step 2 shows the flowing through the chamber of a gaseous medium that when subjected to the radio frequency discharge generates a plasma that includes reactive ions. Step 3 shows the adjusting of the first pressure level within the chamber. Step 4 is the adjusting of the power applied to the top plate in the chamber. Step 5 is the adjusting of the power applied to the bottom plate in the chamber. Step 6 is the adjusting the composition of the plasma cleaning gas while step 7 shows the performing of the plasma cleaning step by activating the cleaning gas and forming a plasma cleaning gas, contacting the gas distribution plate of the chamber or the inside walls of the contact holes with the plasma cleaning gas for a time sufficient to remove polymer residues from the gas distribution plate. The steps of setting the pressure, adjusting the power applied to the top and bottom plate of the reaction chamber and adjusting the composition of the plasma cleaning gas within the reaction chamber are specific and unique for a particular polymer cleaning process. These steps therefore must be specified for each specific polymer cleaning procedure.

The post etch treatment (PET) process of first cleaning the polymer of the GDP, then stripping the polymer from the contact holes is as follows. The three processing steps are performed in the order in which they are listed. This is the preferred cleaning process within the scope of the present invention.
Process Step #1: GDP Cleaning
Etching chamber pressure: 250 to 350 milli Torr
Source or top plate power: 1500 to 2000 Watts
Bottom plate power: 0 Watts
Gas composition: 1250 to 1750 SCCM $O_2$
Process Step #2: Contact Hole First Polymer Strip
Etching chamber pressure: 15 to 20 milli Torr
Source or top plate power: 1000 to 1500 Watts
Bottom plate power: 175 to 225 Watts
Gas composition: 700 to 800 SCCM $O_2$
Process Step #3: Contact Hole Second Polymer Strip
Etching chamber pressure: 10 to 20 milli Torr
Source or top plate power 1000 to 1500 Watts
Bottom plate power: 0 Watts
Gas composition: 700 to 800 SCCM $O_2$ It can be appreciated that the specific embodiment described is merely illustrative of the basic principles involved and that various modifications can be made hereto by those skilled in the art without departing from the spirit of the present invention. Thus it is apparent that has been provided, in accordance with the present invention, a multi-step etching process.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for removing or etching polymer depositions from inside surfaces of via holes using a plasma process chamber wherein substrates are processed, comprising the steps of:

providing a semiconductor substrate, said substrates having been provided with via holes;

providing a plasma process chamber;

performing Gas Distribution Plate polymer strip processing, wherein a plasma cleaning gas contains between 1250 and 1750 SCCM $O_2$, then;

performing a first via hole polymer strip processing step, wherein a plasma cleaning gas contains between 700 and 800 SCCM $O_2$, partially etching polymer depositions from sidewalls of said via holes; and then performing a second via hole polymer strip processing step, wherein a plasma cleaning gas contains between 700 and 800 SCCM $O_2$, completely etching polymer depositions from sidewalls of said via holes.

2. The method of claim 1 wherein said etching polymer depositions comprises the steps of:

positioning the substrate in said plasma process chamber within which there can be created a radio frequency discharge and wherein pressure can be adjusted;

flowing through the plasma process chamber a gaseous medium that, when subjected to a radio frequency discharge, generates a plasma that includes reactive ions;

adjusting a pressure level within the plasma process chamber;

adjusting a power level applied to a top plate in the plasma process chamber;

adjusting a power level applied to a bottom plate in the plasma process chamber;

adjusting a composition of a plasma cleaning gas in the plasma process chamber; and performing a plasma cleaning step by activating the cleaning gas and forming a plasma cleaning gas, contacting a target surface area within the chamber with the plasma cleaning gas for a time sufficient to remove polymer residues from a target surface area.

3. The method of claim 2 wherein said target surface area is a Gas Distribution Plate within the plasma process chamber.

4. The method of claim 2 wherein said target surface area is a surface that is part of the semiconductor wafer from which polymer needs to be removed.

5. The method of claim 2 wherein said etching of polymer depositions uses a low-pressure batch reactive ion etcher (RIE).

6. The method of claim 2 wherein said etching of polymer depositions uses a magnetically enhanced reactive ion etcher.

7. The method of claim 2 wherein said etching of polymer depositions uses a low-pressure, high-density plasma reactor.

8. The method of claim 1 wherein said Gas Distribution Plate polymer strip processing is:

positioning the substrate in said plasma process chamber within which there can be created a radio frequency discharge and wherein pressure can be adjusted;

flowing through the chamber a gaseous medium that, when subjected to a radio frequency discharge, generates a plasma that includes reactive ions;

adjusting a pressure level within the chamber to between 250 and 350 mTorr;

adjusting a power level applied to a top plate in the plasma process chamber to between 1500 and 2000 Watts;

adjusting a power level applied to a bottom plate in the plasma process chamber to 0 Watts;

adjusting a composition of a plasma cleaning gas to between 1250 and 1750 SCCM $O_2$; and performing a plasma cleaning step by activating the cleaning gas and forming a plasma cleaning gas, contacting a gas distribution plate of the plasma process chamber with the plasma cleaning gas for a time sufficient to remove polymer residues from the gas distribution plate.

9. The method of claim 1 wherein said first via hole polymer strip processing is:

positioning the substrate in said plasma process chamber within which there can be created a radio frequency discharge and wherein pressure can be adjusted;

flowing through the chamber a gaseous medium that when subjected to a radio frequency discharge generates a plasma that includes reactive ions;

adjusting a pressure level within the chamber to between 10 and 20 mTorr;

adjusting a power level applied to a top plate in the chamber to between 1000 and 1500 Watts;

adjusting a power level applied to a bottom plate in the chamber to 175 to 225 Watts;

adjusting a composition of a plasma cleaning gas to between 700 and 800 SCCM $O_2$; and performing a plasma cleaning step by activating the cleaning gas and forming a plasma cleaning gas, contacting the via holes provided in said substrate with the plasma cleaning gas for a time sufficient to partially remove polymer residues from the sidewalls of the contact holes.

10. The method of claim 1 wherein the second via hole polymer strip processing is:

positioning the substrate in a plasma process chamber within which there can be created a radio frequency discharge and wherein pressure can be adjusted;

flowing through the chamber a gaseous medium that when subjected to a radio frequency discharge generates a plasma that includes reactive ions;

adjusting a pressure level within the chamber to between 10 and 20 mTorr;

adjusting a power level applied to a top plate in the chamber to between 1000 and 1500 Watts;

adjusting a power level applied to a bottom plate in the plasma process chamber to 0 Watts;

adjusting a composition of a plasma cleaning gas to between 700 and 800 SCCM $O_2$; and performing a plasma cleaning step by activating the cleaning gas and forming a plasma cleaning gas, contacting the via holes provided in said substrate with the plasma cleaning gas for a time sufficient to completely remove polymer residues from sidewalls of the via holes.

11. A method for removing or etching polymer depositions in a plasma process chamber wherein substrates are processed, comprising the steps of:

positioning the substrate in a plasma process chamber within which there can be created a radio frequency discharge and wherein pressure can be adjusted;

flowing through the chamber a gaseous medium that when subjected to a radio frequency discharge generates a plasma that includes reactive ions;

adjusting a first pressure level within the chamber;

adjusting a first power level applied to a top plate in the chamber;

adjusting a first power level applied to a bottom plate in the chamber;

adjusting a first composition of a plasma cleaning gas, said adjusting a first composition of a plasma cleaning gas consisting of providing 1250 to 1750 SCCM of $O_2$ within the plasma chamber for plasma formation;

performing a plasma cleaning step by activating the cleaning gas and forming a plasma cleaning gas, contacting a gas distribution plate of the plasma process chamber with the plasma cleaning gas for a time sufficient to remove polymer residues from the gas distribution plate;

adjusting a second pressure level within the plasma process chamber;

adjusting a second power level applied to a top plate in the chamber;

adjusting a second power level applied to a bottom plate in the chamber;

adjusting a second composition of a plasma cleaning gas;

performing a plasma cleaning step by activating the plasma cleaning gas, contacting a via hole inner surface with the plasma cleaning gas for a time sufficient to partially remove polymer residues from the via hole inner surface;

adjusting a third pressure level within the chamber;

adjusting a third power level applied to a top plate in the chamber;

adjusting a third power level applied to a bottom plate in the plasma process chamber;

adjusting a third composition of a plasma cleaning gas; and performing a plasma cleaning step by activating the plasma cleaning gas, contacting a via hole inner surface with the plasma cleaning gas for a time sufficient to completely remove polymer residues from the via hole inner surface.

12. The method of claim 11 wherein the step of adjusting the first pressure level within the chamber consists of setting said pressure to 250 to 350 mTorr.

13. The method of claim 11 wherein the step of adjusting the first power level to the top plate in the chamber consists of applying 1500 to 2000 Watts to said plate.

14. The method of claim 11 wherein the step of adjusting the first power level to the bottom plate in the chamber consists of grounding or applying 0 Watts to said plate.

15. The method of claim 11 wherein the step of adjusting the second level within the chamber consists of setting said pressure to 10 to 20 mTorr.

16. The method of claim 11 wherein the step of adjusting the second power level to the top plate in the chamber consists of applying 1000 to 1500 Watts to said plate.

17. The method of claim 11 wherein the step of adjusting the second power level to the bottom plate in the chamber consists of applying 175 to 225 Watts to said plate.

18. The method of claim 11 wherein the step of adjusting the second composition of the plasma cleaning gas consists of providing 700 to 800 SCCM of $O_2$ within the plasma chamber for plasma formation.

19. The method of claim 11 wherein the step of adjusting the third pressure level within the chamber consists of setting said pressure to 10 to 20 mTorr.

20. The method of claim 11 wherein the step of adjusting the third power level to the top plate in the chamber consists of applying 1000 to 1500 Watts to said plate.

21. The method of claim 11 wherein the step of adjusting the third power level to the bottom plate in the chamber consists of grounding or applying 0 Watts to said plate.

22. The method of claim 11 wherein the step of adjusting the third composition of the plasma cleaning gas consists of providing 700 to 800 SCCM of $O_2$ within the plasma chamber for plasma formation.

23. The method of claim 11 wherein said etching of polymer depositions uses a low-pressure batch reactive ion etcher (RIE).

24. The method of claim 11 wherein said etching of polymer depositions uses a magnetically enhanced reactive ion etcher.

25. The method of claim 11 wherein said etching of polymer depositions uses a low-pressure, high-density plasma reactor.

* * * * *

UNITED STATES PATENT AND TRADEMARK OFFICE
CERTIFICATE OF CORRECTION

PATENT NO. : 6,491,042 B1  Page 1 of 1
DATED : December 10, 2002
INVENTOR(S) : Bao-Ru Young and Chia-Shiung Tsai It is certified that error appears in the above-identified patent and that said Letters Patent is hereby corrected as shown below:

<u>Title page,</u>
Item [75], delete "Bao-Ru Young, I-Lam (TW)", and replace with -- Bao-Ru Young, I-Lan, (TW) --.

Signed and Sealed this

Thirteenth Day of May, 2003

JAMES E. ROGAN
*Director of the United States Patent and Trademark Office*